United States Patent [19]

Nagano

[11] Patent Number: 4,536,701
[45] Date of Patent: Aug. 20, 1985

[54] VOLTAGE-CURRENT CONVERTING CIRCUIT

[75] Inventor: Katsumi Nagano, Shimonoseki, Japan

[73] Assignee: Tokyo Shibaura Denki Kabushiki Kaisha, Kawasaki, Japan

[21] Appl. No.: 446,790

[22] Filed: Dec. 3, 1982

[30] Foreign Application Priority Data

Dec. 11, 1981 [JP] Japan .................. 56-199765

[51] Int. Cl.³ .............................................. G05F 3/20
[52] U.S. Cl. ..................................... 323/315; 307/241; 307/254
[58] Field of Search ................. 363/13; 323/312, 313, 323/317, 315; 307/239, 240, 241, 253, 254, 261

[56] References Cited

U.S. PATENT DOCUMENTS 3,982,172  9/1976  van de Plassche ................ 323/317

OTHER PUBLICATIONS

Rudy J. van de Plassche, "A Wideband Monolithic Instrumentation Amplifier," ISSCC 75/Friday, Feb. 14, 1975, IEEE Solid State Circuits Conference.

Primary Examiner—Peter S. Wong
Assistant Examiner—Anita M. Ault
Attorney, Agent, or Firm—Finnegan, Henderson Farabow, Garrett & Dunner

[57] ABSTRACT

A voltage-current converting circuit comprises a plurality of transistors which are applied at the bases with a multiphase voltage, Δ-connection resistor connected between the emitters of the transistors, and current sources respectively connected to the emitters of the transistors.

6 Claims, 21 Drawing Figures

VOLTAGE-CURRENT CONVERTING CIRCUIT

BACKGROUND OF THE INVENTION

The present invention relates to a voltage-current converting circuit for converting an input voltage into a corresponding output current.

With a prior voltage-current converting circuit only a two-phase input voltage could be converted to a corresponding current. There has been a strong demand to convert a three-or-more-phase input voltage into a corresponding current.

SUMMARY OF THE INVENTION

Accordingly, an object of the present invention is to provide a voltage-current converting circuit for converting a multiphase voltage with three or more phases into a corresponding multiphase current.

The above object is achieved by a voltage-current converting circuit comprising at least three transistors whose bases are applied with a multiphase voltage and whose collectors are connected to the output terminals, at least three resistors connected between the emitters of the transistors, and at least three current sources respectively connected to the emitters of the transistors.

DETAILED DESCRIPTION OF THE PREFERRED EMBODIMENTS

Figure 1:
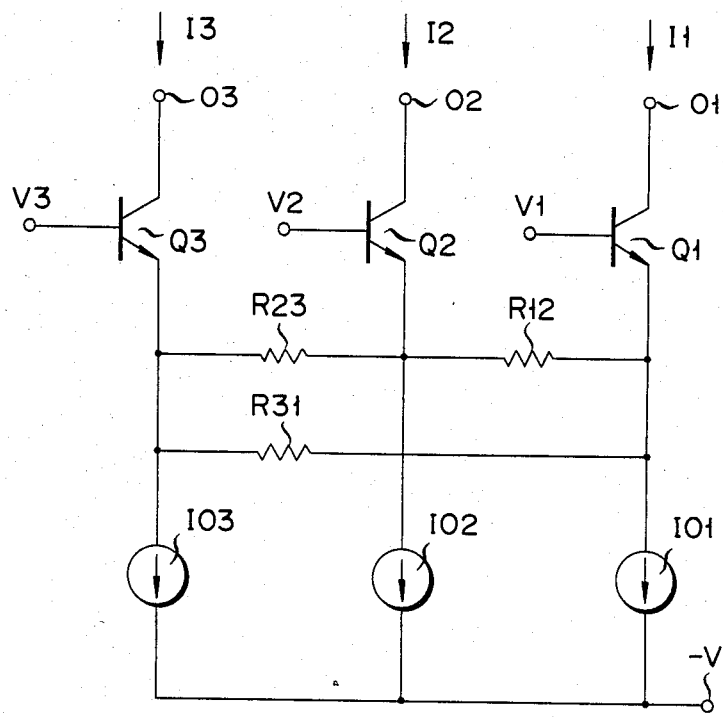
FIG. 1 is a circuit diagram of an embodiment of a voltage-current converting circuit according to the invention.

An embodiment of a voltage-current converting circuit according to the present invention will be described referring to the accompanying drawings. FIG. 1 is a circuit diagram of a first embodiment of the present invention, which is designed for the conversion of a three-phase voltage. The input voltages V1 to V3 of the three phases are respectively applied to the bases of transistors Q1 to Q3. Throughout the specification, the transistors used are all of NPN type. The collectors of the transistors Q1 to Q3 serve as current output terminals O1 to O3, respectively. These output terminals pull output currents I1 to I3, as shown. The emitters of the transistors Q1 to Q3 are connected to a negative power source −V through current sources I01 to I03. Δ-connection resistors R12, R23 and R31 are connected to the emitters of the transistors Q1 to Q3. The resistor R12 is connected between the emitters of the transistors Q1 and Q2; the resistor R23 between the emitters of the transistors Q2 and Q3; and the resistor R31 between the transistors Q3 and Q1.

The operation of the present embodiment will be given. It is assumed that the transistors Q1 to Q3 operate in an active region, and that the common emitter current amplification factor of each transistor is satisfactorily large. The collector current (output current) I1 of the transistor Q1 is the sum of the currents flowing through the current source I01 and the resistors R12 and R31. A current flowing through the resistor R12 from the transistor Q1 to the transistor Q2 is given as a quotient when a voltage between the emitters of the transistors Q1 and Q2 is divided by the resistance of the resistor R12, that is, $$\frac{\{V1 - VBE(Q1)\} - \{V2 - VBE(Q2)\}}{R12}$$

Currents flowing through the resistors R23 and R31 are also obtained in a similar way. The collector currents I1 to I3 of the transistors Q1 to Q3 are given $$I1 = I01 + \frac{V1 - V2 + \Delta VBE(21)}{R12} + \frac{V1 - V3 + \Delta VBE(31)}{R31} \quad (1\text{-}1)$$

$$I2 = I02 + \frac{V2 - V3 + \Delta VBE(32)}{R23} + \frac{V2 - V1 + \Delta VBE(12)}{R12} \quad (1\text{-}2)$$

$$I3 = I03 + \frac{V3 - V1 + \Delta VBE(13)}{R31} + \frac{V3 - V2 + \Delta VBE(23)}{R23} \quad (1\text{-}3)$$

where ΔVBE(IJ) represents a difference between the base-emitter voltage VBE(QI) of the I-th transistor QI and the base-emitter voltage VBE(QJ) of the J-th transistor QJ, that is, VBE(QI)−VBE(QJ). Assuming that the base-emitter voltages VBE of the transistors Q1 to Q3 are equal to each other, and the resistances of the resistors R12, R23 and R31 are all R, the equations (1-1) to (1-3) are simplified into $$I1 = I01 + \frac{1}{R}(2V1 - V2 - V3) \quad (2\text{-}1)$$

$$I2 = I02 + \frac{1}{R}(2V2 - V3 - V1) \quad (2\text{-}2)$$

$$I3 = I03 + \frac{1}{R}(2V3 - V1 - V2) \quad (2\text{-}3)$$

In the equations (2-1) to (2-3), if $I01=I02=I03$, differences between two currents are obtained as follows:

$$I1 - I2 = \frac{3}{R}(V1 - V2) \quad (3\text{-}1)$$

$$I2 - I3 = \frac{3}{R}(V2 - V3) \quad (3\text{-}2)$$

$$I3 - I1 = \frac{3}{R}(V3 - V1) \quad (3\text{-}3)$$

As seen from the above equations, the difference I1–I2 between the output (collector) currents of the transistors Q1 and Q2 is proportional to a difference V1–V2 between the input (base) voltages of the transistors Q1 and Q2. Similarly, the current I2–I3, is proportional to the voltage difference V2–V3, and the current I3–I1 to the voltage difference V3–V1. Here, a proportional coefficient (mutual conductance) is 3/R. As described above, the present embodiment operates as differential type three-phase voltage-current converting circuit.

The description that the base-emitter voltages VBE of the transistors are equal to one another is true only under the condition as given below. Generally, a relationship between the collector current IC of the transistor and the base-emitter voltage VBE is approximately described by a diode formula expressed $VBE=Vt\cdot ln(IC/IS)$. In the formula, Vt is a thermal voltage, IS is a reverse saturation current. When using this formula, differences $\Delta VBE$ between the base-emitter voltages of the two transistors are given $$\Delta VBE(21) = -\Delta VBE(12) = Vt \cdot \ln \frac{I2}{I1} \quad (4\text{-}1)$$

$$\Delta VBE(32) = -\Delta VBE(23) = Vt \cdot \ln \frac{I3}{I2} \quad (4\text{-}2)$$

$$\Delta VBE(13) = -\Delta VBE(31) = Vt \cdot \ln \frac{I1}{I2} \quad (4\text{-}3)$$

It is assumed here that the converting circuit is a small signal circuit (V1, V2, V3 < δ), and that differential input signals are small, V1−V2≈0, V2−V3≈0, and V3−V1≈0. On this assumption, from the equations (1-1) to (1-3), we have I1=I2=I3=I0 (=I01=I02=I03). When this relation holds, $\Delta VBE=0$ is derived from the equations (4-1) to (4-3), and hence the base-emitter voltages VBE of the transistors are all equal to each other. This indicates that the equations (3-1) to (3-3) hold when the converting circuit is used as a small signal circuit. When the input voltage is large and the differential input is not regarded as zero, the equations (3-1) to (3-3) fail to hold. Under this condition, the $\Delta VBE$ appears as an error in the output differential current. The compensation of the error will be given later.

Another embodiment of the present invention will be described. The reference numerals used in the first embodiment will be used for corresponding portions in the other embodiments. While the first embodiment uses a Δ-connection resistor arrangement, a second embodiment uses a Y-connection resistor arrangement. In the second embodiment shown in FIG. 2, resistors R1, R2 and R3 are connected at one end to the emitters of the transistors Q1 to Q3. The other ends of the resistors are connected together.

The operation of the second embodiment will now be described. When a voltage at the common connection point of the resistors R1 to R3 is VS, the sum of the current flowing into the common connection point is zero. Therefore, the following equation holds $$\frac{V1 - VBE(Q1) - VS}{R1} + \frac{V2 - VBE(Q2) - VS}{R2} + \frac{V3 - VBE(Q3) - VS}{R3} = 0 \quad (5)$$

In the equation (5), if the base-emitter voltages VBE of the transistors are negligible when compared with the input voltages V1 to V3, the following equation holds $$VS = \frac{V1/R1 + V2/R2 + V3/R3}{1/R1 + 1/R2 + 1/R3} \quad (6)$$

$$= \frac{1}{3}(V1 + V2 + V3)$$

In the above equation, the resistors R1 to R3 are all equal to each other (R1=R2=R3=R). The collector current I1 of the transistor Q1 is obtained as the sum of the current I01 of the current source and the current flowing through the resistor R1. The collector currents I2 and I3 are also obtained in a similar manner.

$$I1 = I01 + \frac{V1 - V2}{R} \quad (7\text{-}1)$$

$$= I01 + \frac{1}{3R}(2V1 - V2 - V3)$$

$$I2 = I02 + \frac{1}{3R}(2V2 - V3 - V1) \quad (7\text{-}2)$$

$$I3 = I03 + \frac{1}{3R}(2V3 - V1 - V2) \quad (7\text{-}3)$$

When the equations (7-1) to (7-3) are compared with the equations (2-1) to (2-3) defining the output currents in the first embodiment with the Δ-connection resistor arrangement, the former is different from the latter only in the proportional coefficient (mutual conductance). Therefore, the equations (7-1) to (7-3) are equivalent to those (2-1) to (2-3), respectively. From the equations (7-1) to (7-3), differences between the two currents are given by $$I1 - I2 = \frac{1}{R}(V1 - V2) \quad (8\text{-}1)$$

$$I2 - I3 = \frac{1}{R}(V2 - V3) \quad (8\text{-}2)$$

$$I3 - I1 = \frac{1}{R}(V3 - V1) \quad (8\text{-}3)$$

The difference of the equations (8-1) to (8-3) from the equations (3-1) to (3-3) is only in the coefficients in the voltage terms.

A two-phase prior voltage-current converting circuit shown in FIG. 3 will be described to show correctness of the operating principle of the present invention. The circuit shown in FIG. 3 may be considered as a two-phase voltage-current converting circuit using the Y-connection resistor arrangement. Also in this circuit, the sum of the currents flowing into a mid-point is zero. Therefore, the following equation hold.

$$\frac{V1 - VS}{R1} + \frac{V2 - VS}{R2} = 0 \tag{9}$$

$$VS = \frac{V1/R1 + V2/R2}{1/R1 + 1/R2} = \frac{1}{2}(V1 + V2)$$

Where VBE(Q1)=VBE(Q2) and R1=R2=R. From the equations (9) and (6), a potential VS at a mid-point in the Y-connection resistors in the case of a N-phase voltage-current converting circuit is given by $$VS = \frac{\sum_{I=1}^{N} VI/RI}{\sum_{I=1}^{N} 1/RI} = \frac{1}{N} \sum_{I=1}^{N} VI \tag{10}$$

where, R1=R2= ... =RN=R.

Figure 3:
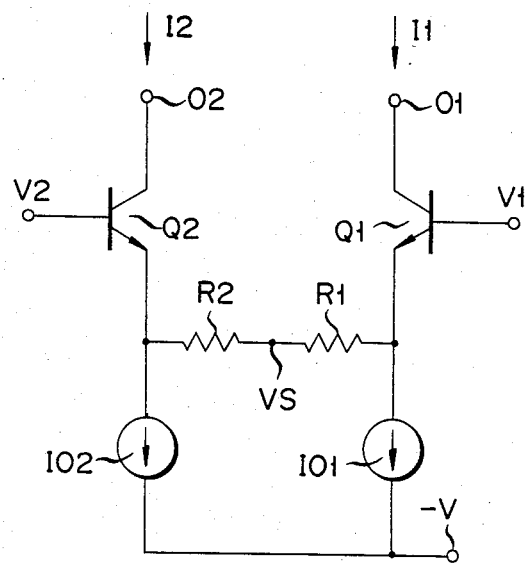
FIG. 3 is a circuit diagram of a prior art two-phase voltage-current converting circuit similar to the second embodiment.

In FIG. 3, the collector currents I1 and I2 of the transistors Q1 and Q2 are given $$I1 = I01 + \frac{V1 - VS}{R1} \tag{11-1}$$

$$= I01 + \frac{1}{2R}(V1 - V2)$$

$$I2 = I02 + \frac{1}{2R}(V2 - V1) \tag{11-2}$$

From the equations (11-1) and (11-2), and (7-1) to (7-3), the collector currents II of the I-th transistor QI in the N-phase voltage-current converting circuit are given by $$II = I0I + \frac{1}{NR}\{-V1 - V2 - \ldots - V(I-1) + \tag{12}$$
$$(N-1)VI - V(I+1) - \ldots - VN\}$$

In FIG. 3, a difference between the two collector currents is given by $$I1 - I2 = \frac{1}{R}(V1 - V2) \tag{13}$$

In this case, the currents I01 and I02 of the current sources are assumed to be equal to each other. The equation (13) is equivalent to the equations (8-1) to (8-3) in the three-phase voltage-current converting circuit. Thus, the operation principle of the present invention is also applicable for the known two-phase circuit. Consquently, the operation principle of the present invention is correct. We can obtain the collector current II and I(I+1) of the I-th and (I+1)th transistors QI and Q(I+1) in the N-phase converter, from the equation (12).

$$II = I0I + \frac{1}{NR}\{-V1 - V2 - \ldots + (N-1)VI - \tag{14-1}$$
$$V(I+1) - \ldots - VN\}$$

$$I(I+1) = I0(I+1) + \frac{1}{NR}\{-V1 - V2 - \ldots - VI + \tag{14-2}$$
$$(N-1)V(I+1) - V(I+2) - \ldots - VN\}$$

From the equations (14-1) and (14-2), a difference between the two output currents in the case of the N-phase converter is generally expressed as $$II - I(I+1) = \frac{1}{NR}[\{(N-1)VI - V(I+1)\} \tag{15}$$
$$-\{VI + (N-1)V(I+1)\}]$$
$$= \frac{1}{R}\{VI - V(I+1)\}$$

The equation (15) is equivalent to the equations (8-1) to (8-3) and (13) in the three-phase and two-phase converters.

Figure 2:
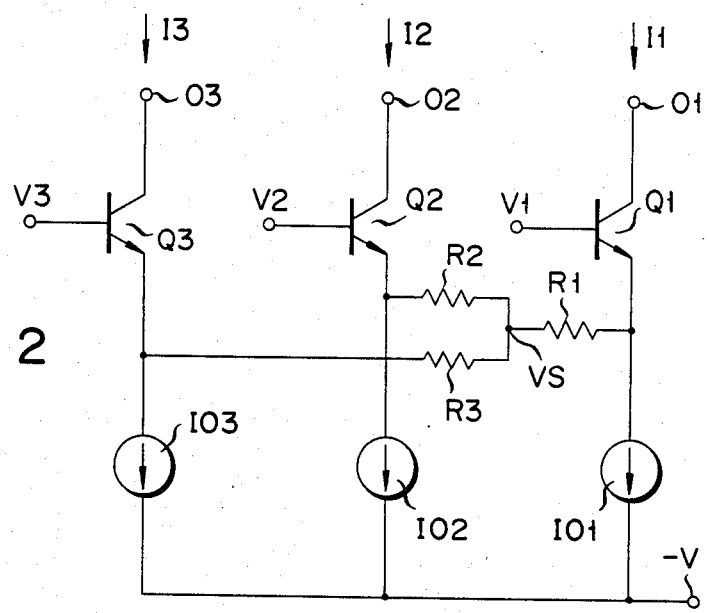
FIG. 2 is a circuit diagram of a second embodiment of the present invention.
Figure 4:
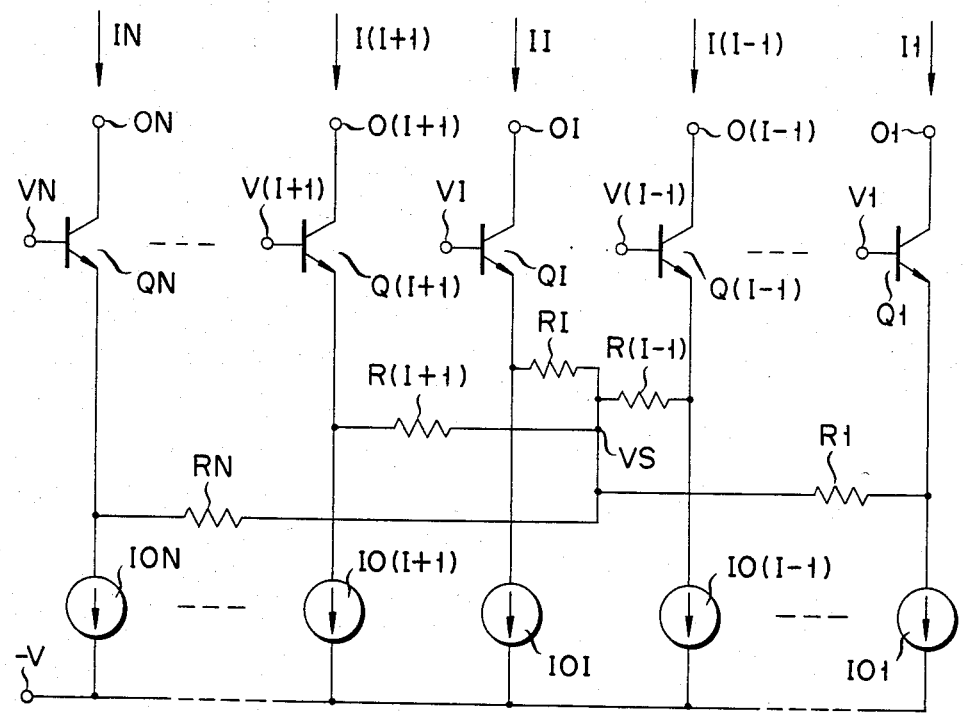
FIGS. 4 and 5 show circuit diagrams of third and fourth embodiments respectively corresponding to the FIGS. 2 and 1 embodiments which are modified into an N-phase voltage-current converting circuit.

A third embodiment of the invention shown in FIG. 4 is the voltage-current converting circuit arrangement with the Y-connection resistors illustrated in FIG. 2 modified into the N-phase voltage-current converting circuit. In the third embodiment, the mid-point voltage VS is expressed by $$\frac{V1 - VS}{R1} + \frac{V2 - VS}{R2} + \ldots + \frac{VI - VS}{RI} + \ldots + \tag{16}$$
$$\frac{VN - VS}{RN} = 0$$

$$VS = \frac{\sum_{I=1}^{N} VI/RI}{\sum_{I=1}^{N} 1/RI}$$

If $$\sum_{I=1}^{N} 1/RI \neq 0, R1 = R2 = \ldots = RI = \ldots = RN = R,$$

the equation (16) can be rewritten into $$VS = \frac{1}{N} \sum_{I=1}^{N} VI \tag{17}$$

The equation (17) is equal to the equation (10). This indicates that the third embodiment also operates as the voltage-current converting circuit.

Figure 5:
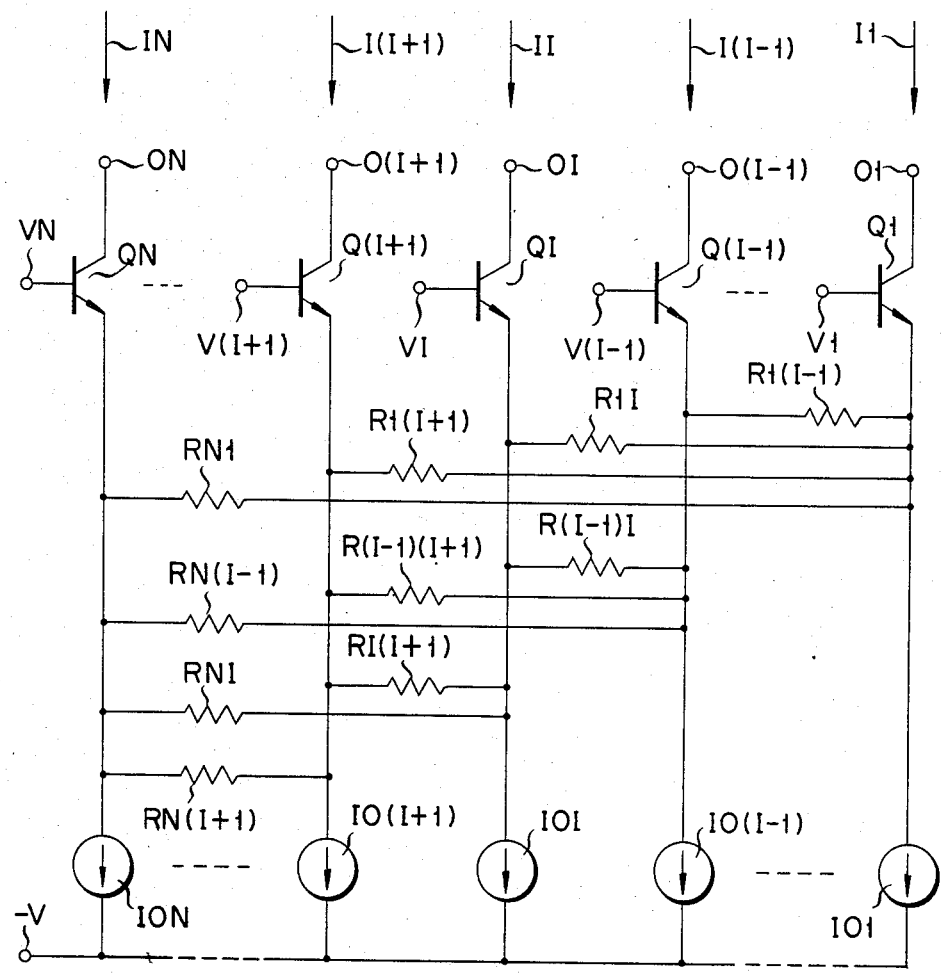

FIG. 5 illustrates an N-phase voltage-current converting circuit of the Δ-connection type according to a fourth embodiment of the present invention. The present embodiment is a modification of the first embodiment shown in FIG. 1. As shown in FIG. 5, the emitter of a transistor QI (I: 1 to N) is connected to the emiter of a transistor QJ (J: I+1 to N) through a resistor RJI.

If the base-emitter voltage VBE of the transistors are equal to each other, the collector currents II and I(I+1) of the I-th and (I+1)th transistors are $$II = I0I + \sum_{J=1}^{I-1} \frac{VI - VJ}{RIJ} + \sum_{J=I+1}^{N} \frac{VI - VJ}{RIJ} \tag{18-1}$$

$$I(I+1) = I0(I+1) + \sum_{J=1}^{I} \frac{V(I+1) - VJ}{R(I+1)J} + \tag{18-2}$$
$$\sum_{J=I+2}^{N} \frac{V(I+1) - VJ}{R(I+1)J}$$

In the resistors RIJ are equal to one another and denoted as R, the equations (18-1) and (18-2) are expressed by $$II = I0I + \frac{N-1}{R} VI - \sum_{J=1}^{I-1} \frac{VJ}{R} - \sum_{J=I+1}^{N} \frac{VJ}{R} \tag{19-1}$$

-continued $$I(I+1) = I0(I+1) + \frac{N-1}{R} V(I+1) - \sum_{J=1}^{I} \frac{VJ}{R} - \quad (19\text{-}2)$$

$$\sum_{J=I+2}^{N} \frac{VJ}{R}$$

A difference between the two currents is $$II - I(I+1) = \frac{N-1}{R} \{VI - V(I+1)\} + \frac{VI}{R} \quad (20)$$

$$- \frac{V(I+1)}{R}$$

$$= \frac{N}{R} \{VI - V(I+1)\}$$

The equation (20) is equivalent to the equations (3-1) to (3-3) in the case of the three-phase converter. The present embodiment also serves as the voltage-current converting circuit.

Figure 6:
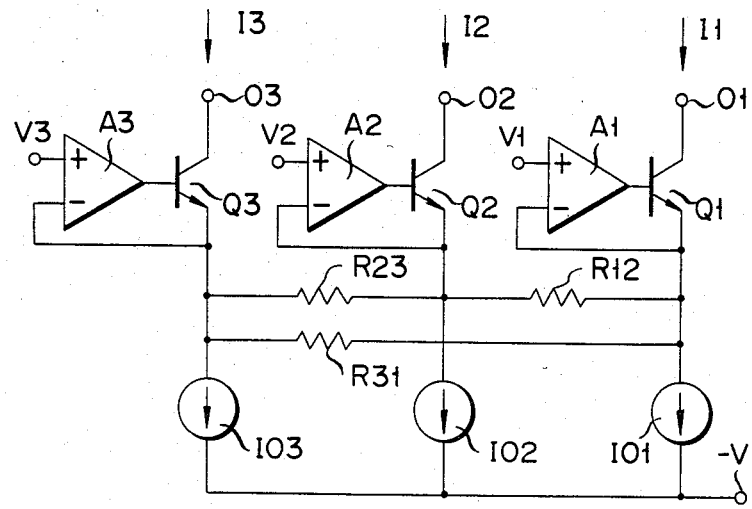
FIGS. 6 and 7 are circuit diagrams of fifth and sixth embodiments which are the FIGS. 1 and 2 embodiments but improved in accuracy.

The above-mentioned embodiments have been described on the assumption that the base-emitter voltages of the transistors are equal to each other. An embodiment of the invention for compensating for an error due to the ΔVBE will now be described. FIG. 6 shows a fifth embodiment which is an improvement of the first embodiment of the three-phase Δ-connection type shown in FIG. 1. In the present embodiment, operational amplifiers A1 to A3 are provided at the prestage of the transistors Q1 to Q3, respectively. Three-phase input voltages V1 to V3 are coupled with noninverting input terminals of the operational amplifiers A1 to A3, respectively. The output signals from the operational amplifiers A1 to A3 are respectively supplied to the bases of the transistors Q1 to Q3. The emitters of the transistors Q1 to Q3 are coupled with the inverting input terminals of the operational amplifiers A1 to A3, respectively.

With such an arrangement, the operational amplifiers A1 to A3 operate as voltage followers because of their negative feedback action. The input voltages V1 to V3 are exactly transferred to the connection points of the resistors R12, R23 and R31, respectively. The errors due to the base-emitter voltages VBE of the transistors are not contained in the collector currents I1 to I3.

Figure 7:
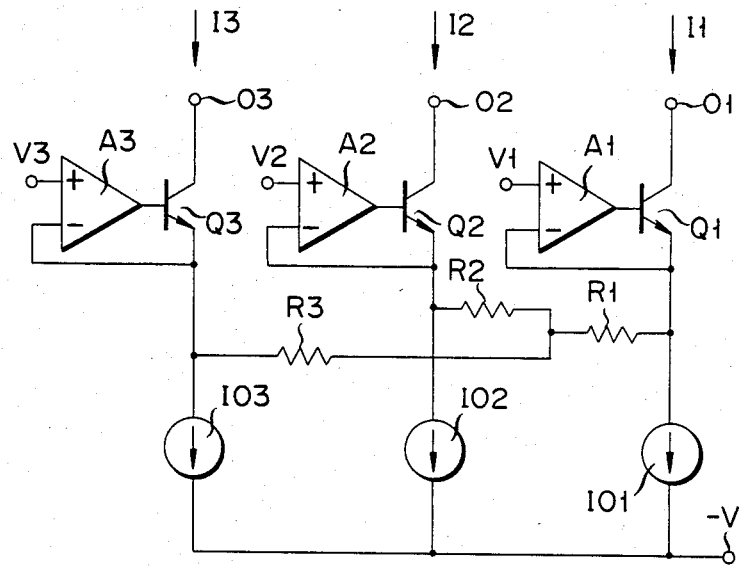

FIG. 7 shows a sixth embodiment of the three-phase Y-connection type and is a modification of the second embodiment of FIG. 2

Figure 8:
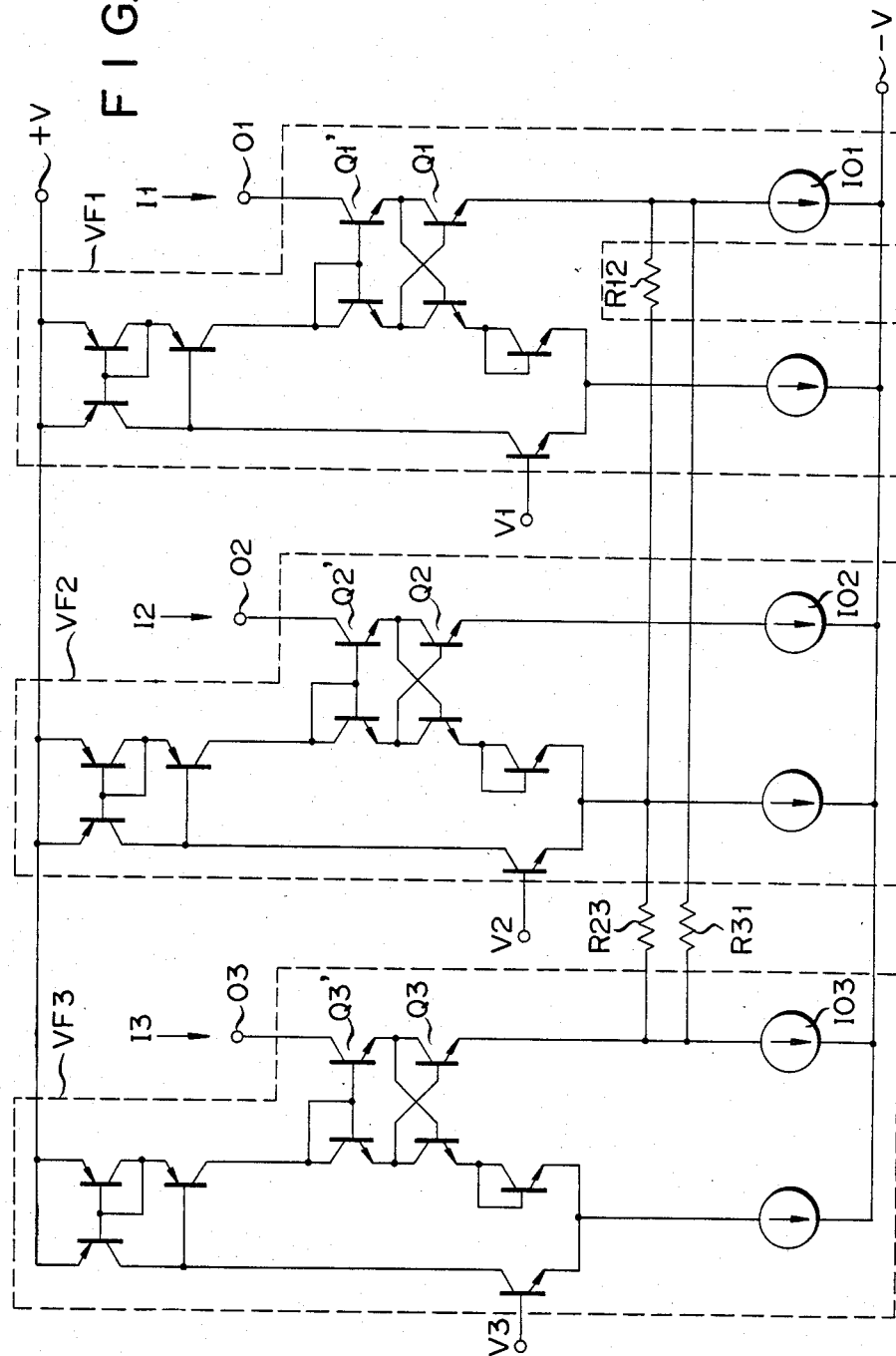
FIGS. 8 and 9 are circuit diagrams of seventh and eighth embodiments, respectively.

FIG. 8 shows a seventh embodiment illustrating an actual arrangement of a voltage-current converting circuit of the three-phase Δ-connection type. The present embodiment, like the fifth embodiment shown in FIG. 6, compensates for the error due to the base-emitter voltage VBE. The present embodiment employs voltage follower circuits VF1 to VF3, in place of the operational amplifiers A1 to A3 of the fifth embodiment. In the voltage follower circuits VF1 to VF3 and the converting circuit, the transistors Q1 to Q3 and the current sources I01 to I03 are shared. The voltage follower circuits VF1 to VF3 directly output a voltage inputted thereto. Input voltages V1 to V3 applied to the input terminals of the VF1 to VF3 are transmitted to the emitters of output transistors Q1 to Q3, respectively. Therefore, voltages at the connection points of the Δ-connection resistors R12, R23 and R31 are equal to the input voltages, respectively, thereby effecting an accurate voltage-current conversion. The output currents I1 to I3 converted are taken out from the collectors of transistors Q1' to Q3' respectively connected in series to the output transistors Q1 to Q3. The present embodiment needs nine transistors for constituting one voltage follower and therefore needs a total of 27 transistors. The present embodiment is not preferable for an integrated fabrication because the number of elements is large. An embodiment of the invention which has successfully reduced the number of elements will be described.

Figure 9:
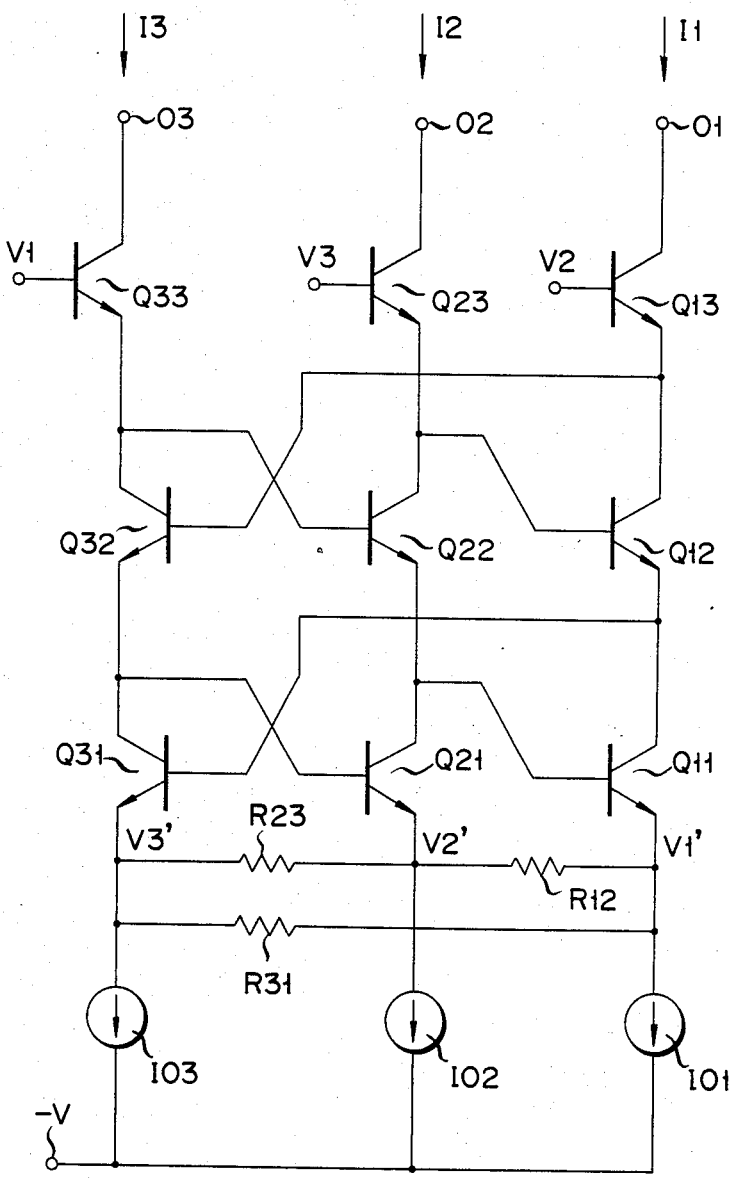

An eighth embodiment of the invention shown in FIG. 9 is different from the seventh embodiment in the arrangement of the voltage follower circuit. As shown, transistors Q11, Q12 and Q13 are connected in series between a current source I01 and an output terminal O1. Transistors Q21, Q22 and Q23 are connected in series between a current source I02 and an output terminal O2. Transistors Q31, Q32 and Q33 are connected in series between a current source I03 and an output terminal O3. Resistors R12, R23 and R31 are each between the emitters of the two transistors. Input voltages V2, V3 and V1 are applied to the bases of the transistors Q13, Q23 and Q33, respectively. The bases of the transistors Q11, Q21 and Q31 are connected to the collectors of the transistors Q21, Q31 and Q11, respectively. The bases of the transistors Q12, Q22 and Q32 are connected to the collectors of the transistors Q22, Q32 and Q12, respectively. If the emitter areas of these transistors are equal to each other in the transistor circuit, a voltage between the base of the transistor Q13 and the emitter of the transistor Q11 is equal to a voltage between the base of the transistor Q23 and the emitter of the transistor Q21 and a voltage between the base of the transistor Q33 and the emitter of the transistor Q31. When the emitter areas of the transistors are different from one another, these voltages depend on the emitter areas of the transistors.

The operation of the embodiment thus arranged will be described. The emitter voltages of the transistors Q11, Q21 and Q31, denoted as V1', V2' and V3' respectively, are given by the following equations.

$$V1' = V1 - \{VBE(33) + VBE(22) + VBE(11)\} \quad (21\text{-}1)$$

$$V2' = V2 - \{VBE(13) + VBE(32) + VBE(21)\} \quad (21\text{-}2)$$

$$V3' = V3 - \{VBE(23) + VBE(12) + VBE(31)\} \quad (21\text{-}3)$$

In the circuit under discussion, the base voltages of the transistors Q13, Q23 and Q33 are selected to be equal to each other. These transistors are biased so as to operate in an active region, with application of a proper voltage to the collectors thereof. Upon biasing of these transistors, the transistors Q11 to Q13, Q21 to Q23 and Q31 to Q33 all operate in an active region. If the common emitter current amplification factor of each transistor is satisfactorily large, the base current of each transistor is negligible. If the transistors Q11 to Q13 have equal emitter areas, the collector currents of the transistors Q11 to Q13 are all I1. Therefore, the base-emitter voltages of these three transistors are equal to each other $$VBE(11) = VBE(12) = VBE(13) = VBE1 \quad (22\text{-}1)$$

The same thing is true for the transistors Q21 to Q23 and Q31 to Q33, and we have $$VBE(21) = VBE(22) = VBE(23) = VBE2 \quad (22\text{-}2)$$

$$VBE(31) = VBE(32) = VBE(33) = VBE3 \quad (22\text{-}3)$$

Substituting the equations (22-1) to (22-3) into the equations (21-1) to (21-3), we have $$V1' = V1 - 3VBE \quad (23\text{-}1)$$

$$V2' = V2 - 3VBE \quad (23\text{-}2)$$

$$V3' = V3 - 3VBE \quad (b\ 23\text{-}3)$$

where $3VBE = VBE1 + VBE2 + VBE3$.

V1′ to V3′ are voltages at the connection points of the Δ-connection resistors, and these are shifted by 3VBE from the input voltages V1 to V3. The shift amounts of the voltages are equal to each other. This indicates that the currents flowing through the resistors R12, R23 and R31 are the same as those when the input voltages V1 to V3 are directly applied to the resistors R12, R23 and R31. Therefore, the output currents I1 to I3 can be respectively expressed by the equations (2-1) to (2-3) and depend on the input voltages V1 to V3. According to the eighth embodiment, the converting accuracy can be improved without increasing the number of elements. Thus, the voltage-current converting circuit provided according to the eighth embodiment is suitable for the integrated fabrication.

Figure 10:
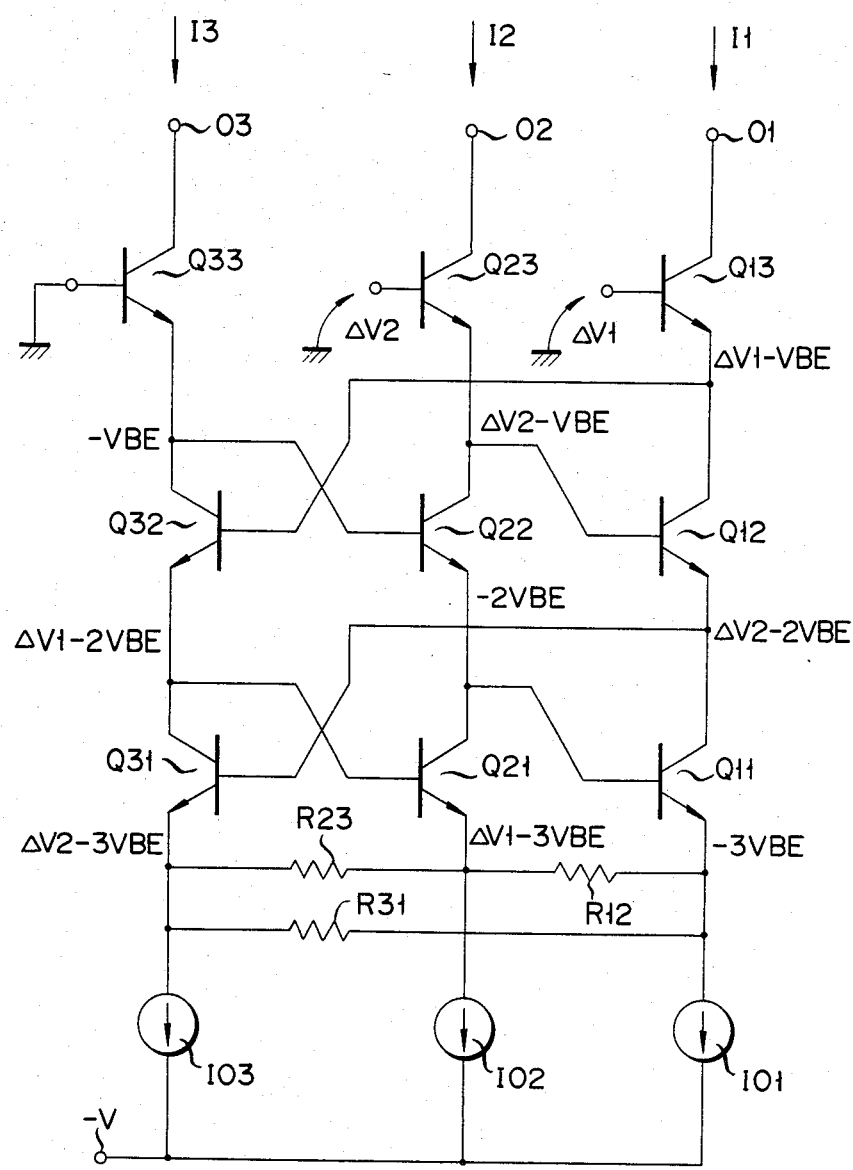
FIG. 10 is a circuit diagram of a circuit used for analyzing the operating condition of the eighth embodiment.

Description will be given about the ranges of the input voltages V2 and V3 with respect to the input voltage V1 as an operating condition of the eighth embodiment. A circuit arrangement useful in the description to follow is illustrated in FIG. 10. A base of the transistor Q33 is grounded and base voltages of the transistors Q13 and Q23 are ΔV1 and ΔV2, respectively. The collector-emitter voltages of the transistors Q32, Q22, Q12 and Q11 are −ΔV1+VBE, ΔV2+VBE, ΔV1−ΔV2+VBE, ΔV1−ΔV2+VBE, −ΔV1+VBE and ΔV2+VBE, respectively. For operating this circuit, the collector-emitter voltages of the transistors must be positive. Hence, the following conditions hold $$\Delta V1 < VBE \quad (24\text{-}1)$$

$$\Delta V2 > -VBE \quad (24\text{-}2)$$

$$\Delta V1 - \Delta V2 + VBE > 0 \quad (24\text{-}3)$$

Figure 11:
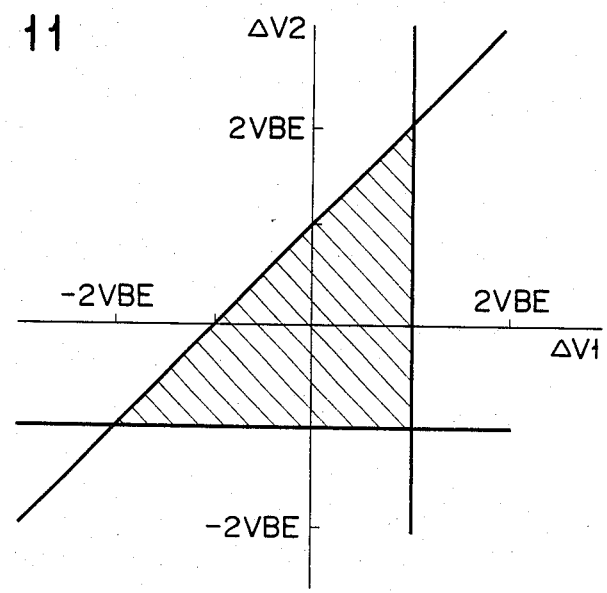
FIG. 11 is a graph illustrating the operating condition of the eighth embodiment.

The conditions of ΔV1 and ΔV2, illustrated in FIG. 11, are derived from the equations (24-1) to (24-3). In the graph, a hatched area indicates an operating area.

Figure 12A:
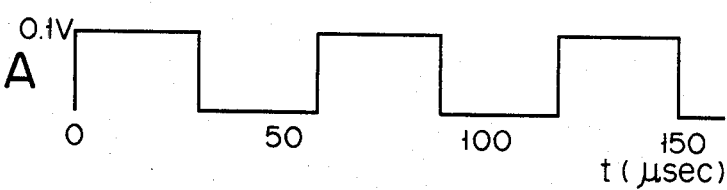
FIGS. 12A to 12C show waveforms of input voltages used when the eighth embodiment is subjected to a computer simulation.
Figure 12B:
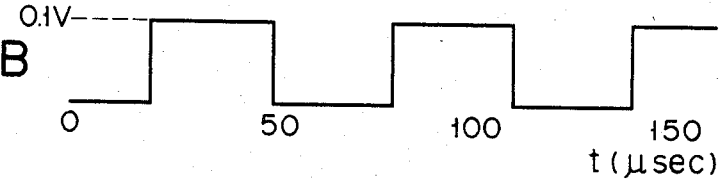
Figure 12C:
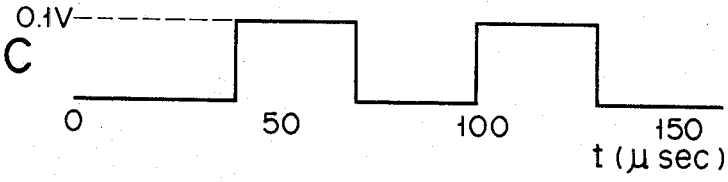
Figure 13A:
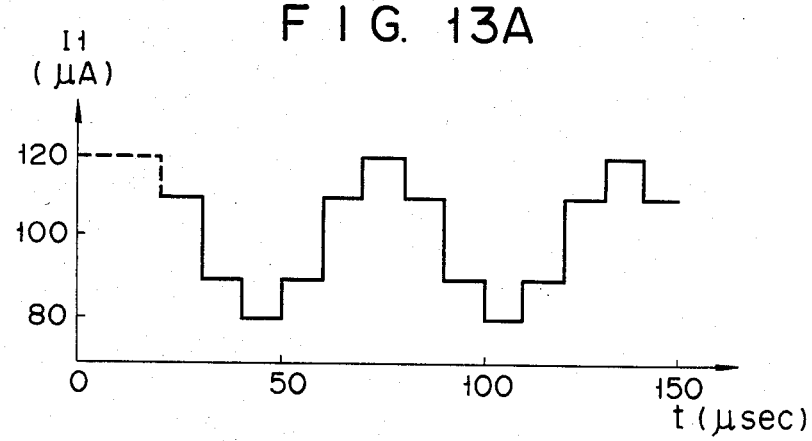
FIGS. 13A to 13C are waveforms of output currents with theoretical values.
Figure 13B:
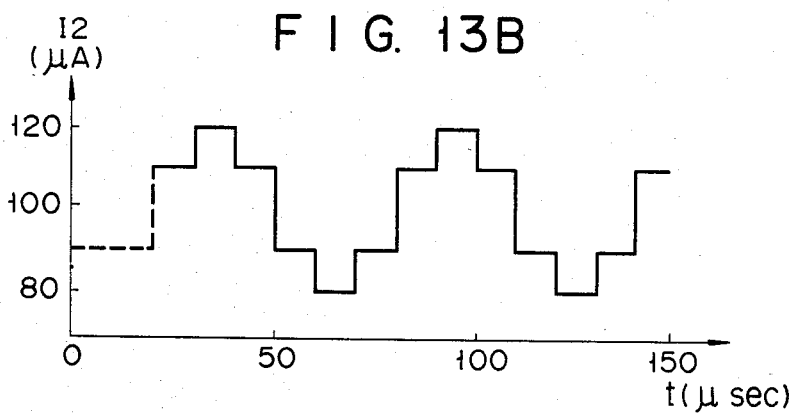
Figure 13C:
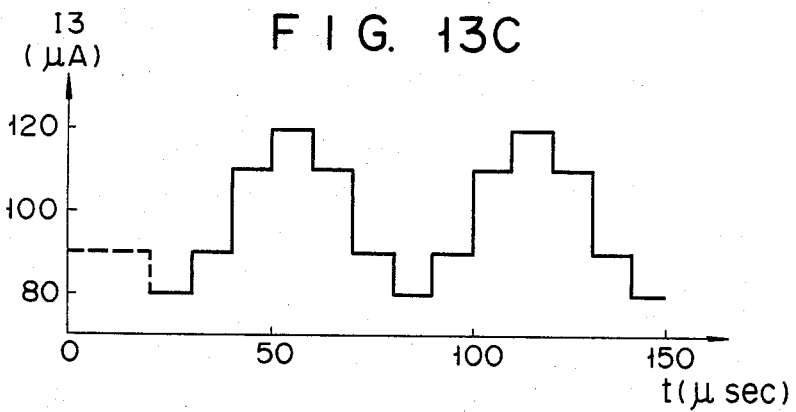
Figure 14A:
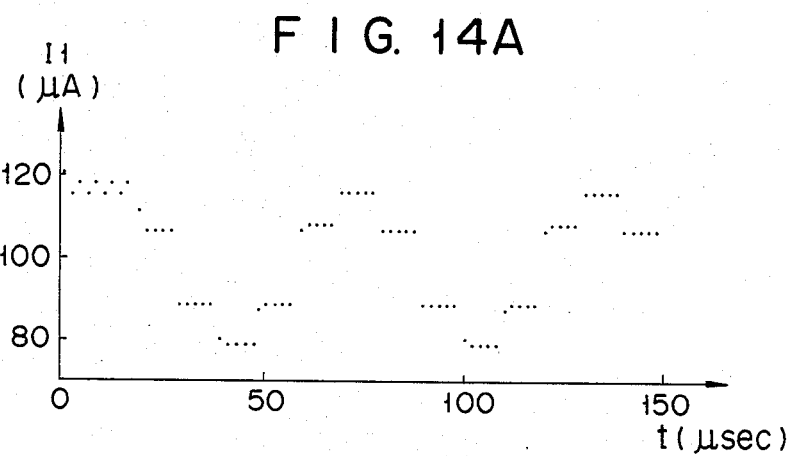
FIGS. 14A to 14C show waveforms of the output currents with simulated values.
Figure 14B:
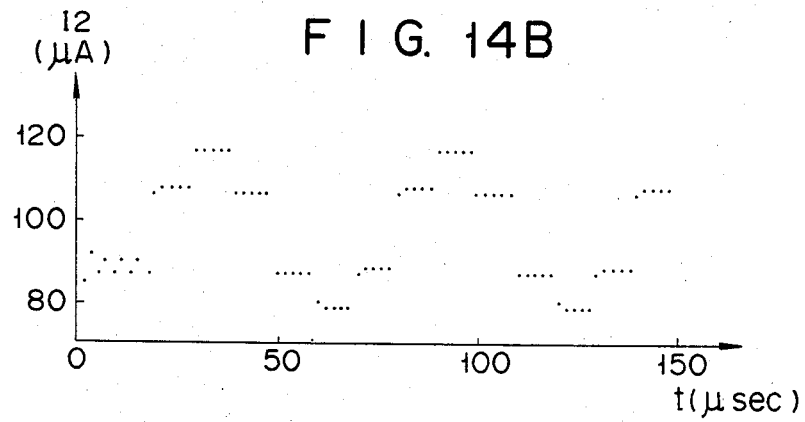
Figure 14C:
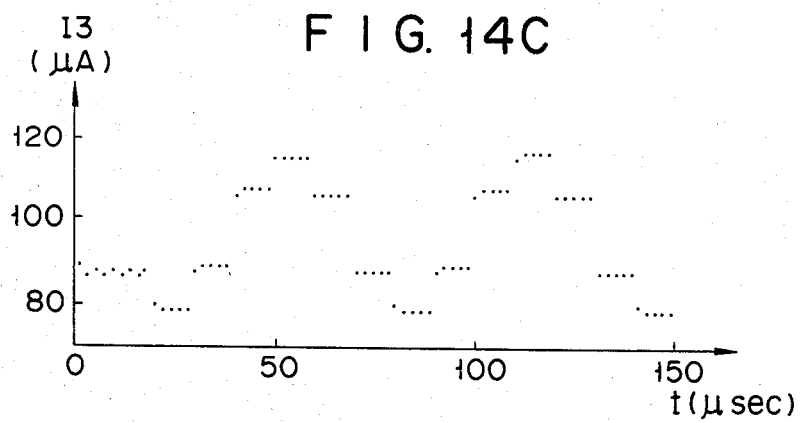

The result of a computer simulation of the eighth embodiment will be given. The circuit of FIG. 9 is used for the simulation. The input voltages are three-phase voltages V1 to V3 with 120° phase difference, as shown in FIGS. 12A to 12C. The amplitude of each input voltage is 0.1 V. The circuit constants are: $I01 = I02 = I03 = 100\ \mu A$, $R12 = R23 = R31 = 10\ K\Omega$. The collector voltage of each of the transistors Q13, Q23 and Q33 is 1 V. The output currents I1 to I3 can be theoretically obtained from the equations (2-1) to (2-3). These theoretical values are shown in FIGS. 13A to 13C. The results of the simulation by a computer every 2 μsec are shown in FIGS. 14A to 14C. These results show that the simulation values have a high correspondence to the theoretical values. The results of the simulation show that a maximum error is a mere −3%. The error is caused when the currents converted from the input voltages by the resistors R12, R23 and R31 pass through three transistors till the output terminals O1, O2 and O3.

Figure 15:
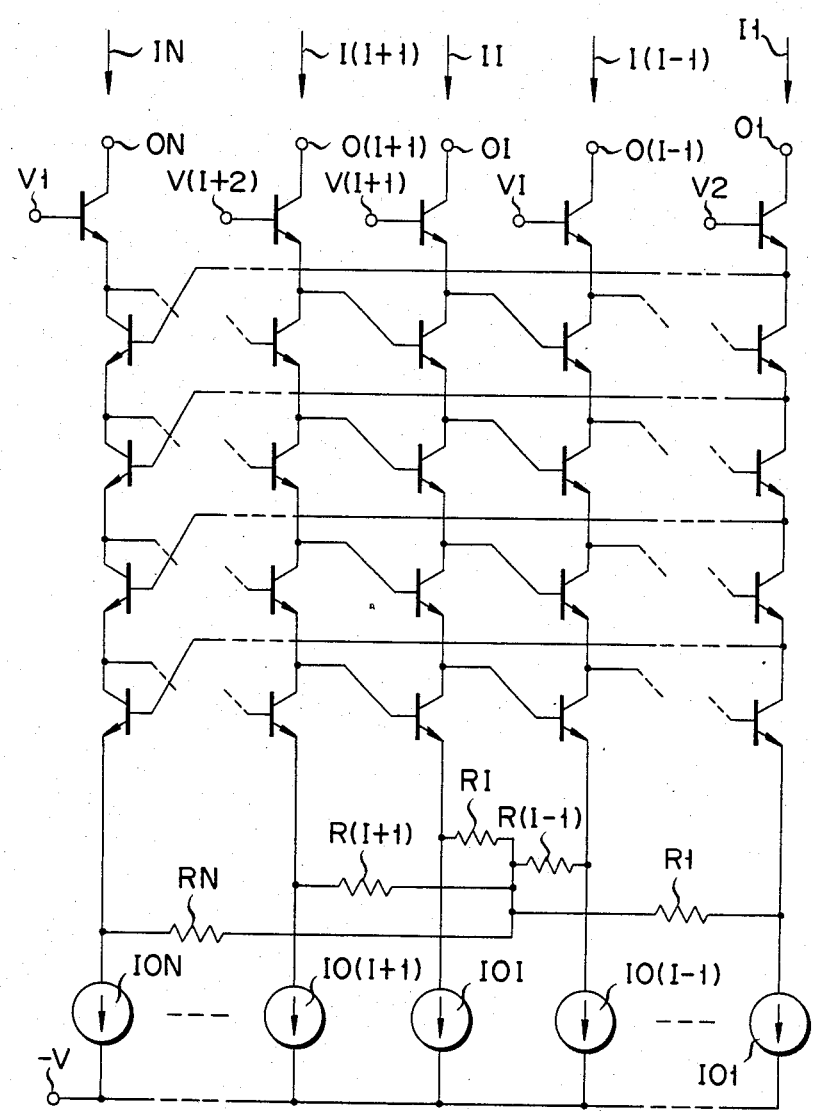
FIG. 15 is a circuit diagram of a ninth embodiment of the present invention.

FIG. 15 shows a circuit arrangement of a ninth embodiment which is a modification of the eighth embodiment into an N-phase voltage-current converting circuit. The present embodiment is designed so as to compensate for the error due to the VBE in the voltage-current converting circuit of the N-phase Y-connection type shown in FIG. 4. In FIG. 15, if the Y-connection resistor arrangement is substituted by a Δ-connection resistor arrangement, the FIG. 15 circuit is a modification of the FIG. 5 embodiment.

What is claimed is:

1. A voltage-current converting circuit comprising:
   at least three input transistors, the bases of said transistors receiving a multiphase voltage, the collectors of said transistors being connected to respective output terminals, and the emitters of said transistors being respectively connected to their own bases through voltage follower circuits;
   voltage-current converting means including a plurality of Δ-connection resistors, each of said resistors being connected between the emitters of two adjacent input transistors; and
   current sources of the same number as said input transistors and connected to the emitters of said input transistors, respectively.

2. A voltage-current converting circuit according to claim 1 in which said voltage follower circuits each comprise an operational amplifier which has a multiphase input applied to its noninverting input terminal, and which has its output terminal and inverting input terminal connected respectively to the base and the emitter of the corresponding input transistor.

3. A voltage-current converting circuit comprising:
   at least three input transistors applied at the bases with a multiphase voltage and connected at the collectors to respective output terminals;
   current sources of the same number as said input transistors and connected to the emitters of said input transistors; and
   voltage-current converting means including a plurality of Δ-connection resistors, each of said resistors being connected between the emitters of two adjacent input transistors,
   the emitters of said input transistors being respectively connected through the collector-emitter paths of a cross-coupled group of transistors to ends of the resistors, the base of one transistor being connected to the collector of another transistor in said cross-coupled group of transistors.

4. A voltage-current converting circuit comprising:
   at least three input transistors, the bases of said transistors receiving a multiphase voltage, the collectors of said transistors being connected to respective output terminals, and the emitters of said transistors being respectively connected to their own bases through voltage follower circuits;
   voltage current converting means including a plurality of Y-connection resistors, each of said resistors having one end connected to a respective one of the emitters of said input transistors, with the other end of said resistors being connected together; and current sources of the same number as said input transistors and connected to the emitters of said input transistors, respectively.

5. A voltage-current converting circuit according to claim 4 in which said voltage follower circuits each comprise an operational amplifier which has a multiphase input applied to its noninverting input terminal, and which has its output terminal and inverting input terminal connected respectively to the base and the emitter of the corresponding input transistor.

6. A voltage-current converting circuit comprising:
at least three input transistors applied at the bases with a multiphase voltage and connected at the collectors to respective output terminals;
current sources of the same number as said input transistors and connected to the emitters of said input transistors; and
voltage-current converting means including a plurality of Y-connection resistors, each of said resistors having one end connected to a respective one of the emitters of said input transistors with the other ends of said resistor being connected together,
the emitters of said input transistors being respectively connected through the collector-emitter paths of a cross-coupled group of transistors to ends of the resistors, and the base of one transistor being connected to the collector of another transistor in the cross-coupled group of transistors.

* * * * *